United States Patent [19]
Suzuki et al.

[11] Patent Number: 6,048,764
[45] Date of Patent: Apr. 11, 2000

[54] METHOD FOR PRODUCING SEMICONDUCTOR DEVICE WITH CAPACITOR STACKED

[75] Inventors: Hiroshi Suzuki; Akira Kubo, both of Tokyo, Japan

[73] Assignee: NEC Corporation, Tokyo, Japan

[21] Appl. No.: 08/800,121

[22] Filed: Feb. 13, 1997

[30] Foreign Application Priority Data

Feb. 13, 1996 [JP] Japan .................................... 8-025618

[51] Int. Cl.$^7$ .............................................. H01L 21/8242
[52] U.S. Cl. ........................................... 438/253; 438/775
[58] Field of Search ................... 438/253–256, 438/396–399, 775

[56] References Cited

U.S. PATENT DOCUMENTS

| | | |
|---|---|---|
| 5,578,516 | 11/1996 | Chou . |
| 5,592,024 | 1/1997 | Aoyama et al. ........................ 257/751 |
| 5,629,225 | 5/1997 | Iwakiri et al. ............................ 438/397 |
| 5,700,709 | 12/1997 | Park et al. . |
| 5,759,893 | 6/1998 | Wu ........................................ 438/254 |

FOREIGN PATENT DOCUMENTS

| | | |
|---|---|---|
| 3-165552 | 7/1991 | Japan . |
| 3165552 | 7/1991 | Japan . |
| 3-214767 | 9/1991 | Japan . |
| 4-29319 | 1/1992 | Japan . |
| 5-190537 | 7/1993 | Japan . |
| 7-211790 | 8/1995 | Japan . |

OTHER PUBLICATIONS

H. Mori et al., "Analysis of Isolation Degradation Induced by Interlayer Material in Capacitor Over Bit–Line (COB) DRAM Cell", Extended Abstracts of the 1994 International Conference on Solid State Devices and Materials, Yokohama, 1994, pp. 904–906.

*Primary Examiner*—Jey Tsai
*Attorney, Agent, or Firm*—Sughrue, Mion, Zinn Macpeak & Seas, PLLC

[57] ABSTRACT

In forming a storage node with sidewalls on interlayer dielectric layer of a semiconductor device, the interlayer dielectric layer having an uppermost silicon oxide film, a silicon nitride film is formed as a protective film on the storage node of poly-silicon formed on the interlayer dielectric layer, and thereafter a poly-silicon layer is deposited and then subjected to an anisotropic etching to partially remove the polysilicon layer to remain, as the side walls, portions of the poly-silicon layer on side surfaces of the storage node, with protecting the storage node by the protective film from the etching and without etching the uppermost silicon oxide film. Alternatively, the uppermost silicon oxide film is subjected to a nitrogen plasma treatment before forming the storage node, and a silicon oxide film can be used as the protective film. The storage node with the side walls can be used as a lower electrode of a stack type capacitor in the semiconductor device after removing the protective film.

3 Claims, 16 Drawing Sheets

METHOD FOR PRODUCING SEMICONDUCTOR DEVICE WITH CAPACITOR STACKED

BACKGROUND OF THE INVENTION

This invention relates to a method for producing a semiconductor device and more particularly to a method for forming a stack type capacitor.

There is known in the prior art a semiconductor device with a stack type capacitor, for example, a dynamic random access memory (DRAM). The stack type capacitor comprises a lower electrode of a storage node formed on an interlayer dielectric layer, a capacitor dielectric film of a metal oxide such as tantalum oxide ($Ta_2O_5$) formed on the storage node, and an upper plate electrode formed on the capacitor dielectric film.

In order to increase a capacitance of the stack type capacitor, it is known in the art to provide side walls of polycrystalline silicon or poly-silicon on the side surfaces of the storage node.

JP-A-03-16552 discloses a method for forming the storage node with the side walls. In the method, a poly-silicon layer for the storage node is formed on the interlayer dielectric layer having a contact hole. The interlayer dielectric layer consists of three films of a silicon oxide film, a silicon nitride film and a silicon oxide film. On the poly-silicon layer, a silicon protective film is also formed, and the poly-silicon layer and the silicon protective film are selectively etched to form the storage node with the protective film on the storage node. Then, a poly-silicon layer is formed on the protective layer and the side surfaces of the storage node. Then, the poly-silicon layer is subjected to the anisotropic etching and is partially remained on the side surfaces as side walls. Thereafter, the protective oxide film on the storage node is etched out.

Thus, the storage node with the side walls are formed. On the storage node and the side walls as the lower electrode, the metal oxide film such as tantalum oxide film is formed as the capacitor dielectric film, and the upper plate electrode is formed on the metal oxide film. Thus, the stack type capacitor is formed in the semiconductor device.

However, the method has a problem described below. When the protective film on the storage node is removed after formation of the side walls, the uppermost silicon oxide film of the interlayer dielectric layer is also partially removed so that a cavity is formed to extend to the underside of the storage node. When a titanium nitride film is formed as the upper plate electrode by the sputtering method on the tantalum oxide as the capacitor dielectric film, the titanium nitride film cannot be formed in the cavity because the sputtering method is poor in the step coverage. Accordingly, the stack type capacitor does not have good properties.

In order to solve the problem, it is proposed to use a silicon oxide film and a silicon nitride film as the protective film and the uppermost film of the interlayer dielectric layer, respectively. According to the proposal, although the cavity is not formed, the silicon nitride film exists as the interlayer dielectric layer of the semiconductor device. This results in a different problem that the semiconductor device suffers from the isolation deterioration and increase of leakage, as is pointed out by Mori et al in a paper entitled "Analysis of Isolation Degradation Induced by Interlayer Material in Capacitor Over-Bit-Line (COB) DRAM Cell" in Extended Abstracts of the 1994 International Conference on Solid State Devices and Materials, Yokahama, 1994, pp. 904–906.

SUMMARY OF THE INVENTION

Therefore, it is an object of this invention to provide a method for forming a storage node with sidewalls without formation of any cavity under the storage node.

It is another object of this invention to provide a method for producing a semiconductor device having a stack type capacitor which is excellent in isolation and leakage.

This invention is applicable to a method for producing a semiconductor device including a storage node with side walls formed on an interlayer dielectric layer on a semiconductor substrate, the interlayer dielectric layer having an uppermost film of silicon oxide. The method comprises steps of: preparing the semiconductor substrate having the interlayer dielectric layer formed thereon; depositing a first poly-silicon layer overlying said interlayer dielectric layer; depositing a silicon nitride layer overlying the first poly-silicon layer; selective etching said first poly-silicon layer and said silicon nitride layer to form the storage node of said first poly-silicon at a predetermined region on the interlayer dielectric layer and a protective layer of said silicon nitride on said storage node, the storage node having side surfaces; depositing a second poly-silicon layer overlying the interlayer dielectric layer, the protective layer and the side surfaces of the storage node; and partially removing the second poly-silicon layer by an anisotropic etching to remain portions of the second poly-silicon layer on the side surfaces of the storage node as said side walls.

In the semiconductor device having a stack type capacitor using the storage node with the side walls as a lower electrode, the method further comprises steps of: removing said protective layer by an isotropic etching treatment using phosphoric acid after partially removing the second poly-silicon layer by an anisotropic etching; depositing a metal oxide as a capacitor dielectric layer over said storage node, the side walls, and said interlayer dielectric layer; depositing an upper electorde over the metal oxide to complete the stack type capacitor.

In the method, a silicon oxide film and a silicon nitride film are used as the uppermost layer of the interlayer dielectric layer and the protective layer for the storage node, respectively. When the silicon nitride film as the protective film is removed by the use of, for example, phosphoric acid, no cavity is formed in the silicon oxide film below the lower electrode. This is because the etching selectivity ratio of silicon nitride film/silicon oxide film for phosphoric acid heated to, for example, 160° C., is in the approximate range of 10–20. When etching out the silicon nitride film of a thickness of 50 nm as the protective film, the amount of the silicon oxide film removed by the etching is several nano meters at most. Though this etching has the possibility of producing such a minute cavity below the storage node, this cavity can be completely filled up by the capacitor dielectric film. Therefore, the upper electrode can be formed without any hindrance.

In the method, the uppermost film of silicon oxide is free from impurities.

When the silicon oxide film containing no impurity is used as the uppermost silicon oxide film of the interlayer dielectric layer, the etching rate of this film by phosphoric acid is lowered and the etching selectivity ratio of this film to silicon nitride film is increased. When the BPSG film which is widely known as an oxide film containing impurities is used as the uppermost silicon oxide film, the etching selectivity ratio is inevitably lowered to about one half.

In the method, the silicon nitride layer has a thickness of 30–100 nm.

The range of 30–100 nm of the thickness is determined by the following reason. The lower limit of 30 nm is decided as a minimum thickness for serving as the protective layer for protecting the storage node during the anistropic etching of the the polysilicon layer to form the side walls. The reason for the upper limit of 100 nm is that the larger thickness prolong the time required for etching out the protective film so that the silicon oxide film of the interlayer dielectric layer is etched out to form a cavity. In addition, the silicon nitride layer of the larger thickness has an increased stress to cause deformation of the substrate and/or a crack of the interlayer dielectric layer.

According to another aspect of this invention, another method for producing the semiconductor device can be obtained. The method comprises steps of: preparing the semiconductor substrate having the interlayer dielectric layer formed thereon; nitrogen plasma treating the uppermost of silicon oxide; and thereafter forming the storage node with the side walls.

The step of forming the storage node with the side walls comprises substeps of: depositing a first poly-silicon layer overlying the interlayer dielectric layer; depositing a silicon oxide layer overlying the first poly-silicon layer; selectively etching the first poly-silicon layer and the silicon oxide layer to form the storage node of the first poly-silicon at a predetermined region on the interlayer dielectric layer and a protective layer of the silicon oxide on the storage node, the storage node having side surfaces; depositing a second poly-silicon layer overlying the interlayer dielectric layer, the protective layer and the side surfaces of the storage node; and partially removing the second poly-silicon layer by an anisotropic etching to remain portions of the second polysilicon layer on the side surfaces of the storage node as the side walls.

In the method for producing semiconductor device having a stack type capacitor using the storage node with the side walls as a lower electorde, the method further comprises steps of: removing the protective layer by an isotropic etching treatment using phosphoric acid after partially removing the second poly-silicon layer by the anisotropic etching; depositing a metal oxide as a capacitor dielectric layer over the storage node, the side walls, and the interlayer dielectric layer; and depositing an upper electorde over the metal oxide to complete the stack type capacitor.

DETAILED DESCRIPTION OF THE INVENTION

Figure 1A:
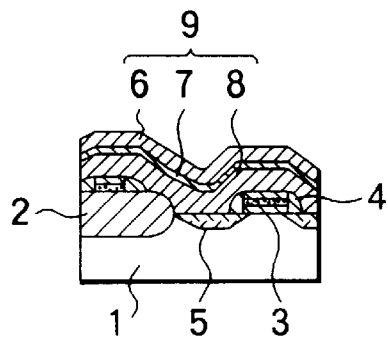
FIGS. 1A to 1F are sectional views illustrating different steps of a known method for production of a semiconductor device having a stack type capacitor therein.

Prior to description of preferred embodiments of this invention, known methods will be described with reference to the drawing for the sake of supporting the better understanding of this invention.

Referring to FIGS. 1A to 1F, description will be made as regards a known method disclosed in JP-A-3 165552. At first, a field insulating film 2 for separating or isolating an element area is formed on a silicon substrate 1, as shown FIG. 1A. Thereafter, a gate insulating film 3, a gate electrode 4, and an n-type diffusion layer 5 are provided on the element area, and then an interlayer dielectric layer 9 is formed which consists of three films of silicon oxide film 6/silicon nitrile film 7/silicon oxide film 8.

Figure 1B:
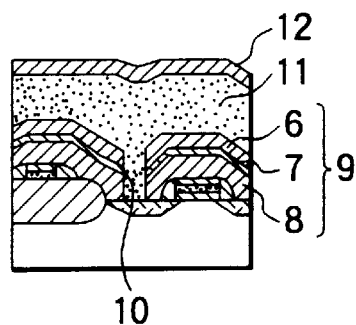

Then, as shown in FIG. 1B, a contact hole 10 is bored in the interlayer dielectric layer 9, and formation is subsequently carried out of a polycrystalline silicon layer 11 for a storage node and a silicon oxide film 12 as an etching stopper for protecting the storage node in a following etching step.

Figure 1C:
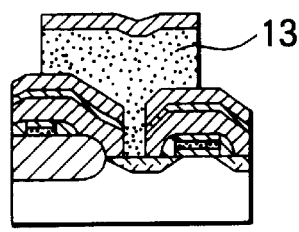

Then, as shown in FIG. 1C, a storage node 13 is formed by selectively etching the polycrystalline silicon layer 11 and the silicon oxide film 12.

Figure 1D:
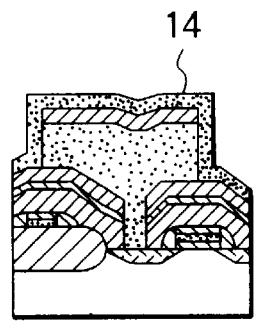
Figure 1E:
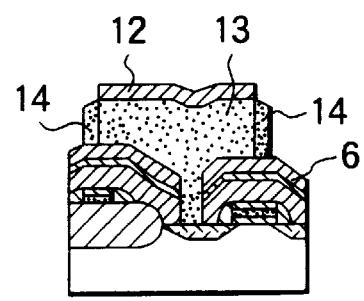

Then, as shown in FIG. 1D, a polycrystalline silicon layer 14 for side walls of the storage node 13 is formed, and it is subjected to reactive ion etching (hereinafter referred to as "RIE") so that it remains only on the side wall surfaces of the storage node 13 as shown in FIG. 1E. During the course of this RIE, the silicon oxide film 12 functions as the etching stopper which prevents the storage node 13 from being etched.

Figure 1F:
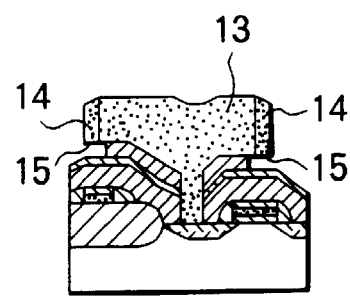

Finally, as shown in FIG. 1F, the silicon oxide film 12 on the storage node 13 is removed.

Thus, the storage node 13 with side walls 14 is formed as a lower electrode of a stack type capacitor in the semiconductor device. On the lower electrode, a metal oxide film such as tantalum oxide is formed and then, an upper electrode is formed thereon to complete the capacitor.

However, the method described above has a problem as described in the preamble. In detail, during etching the silicon oxide film 12 on the storage node 13, the uppermost silicon oxide film 6 of the interlayer dielectric layer 9 below the storage node 13 is also etched. Accordingly, a cavity 15 is made below the storage node 13 as shown in FIG. 1F. The presence of the cavity 15 deteriorates the properties of the capacitor to a great extent. The reason for the serious deterioration will be explained below.

In the capacitor using the storage node with side walls as the lower electrode, the tantalum oxide film is formed on the storage node and the side walls, and the upper electrode or a plate electrode is formed on the tantalum oxide film. A titanium nitride film is often used for the upper plate electrode in view of the optimal leak current property obtained. The sputtering method and the CVD method are available for the formation of the titanium oxide film. Although the film produced by the CVD method is excellent in the step coverage, the technique has not yet been sufficiently developed so that a high quality film cannot be produced. Further, the raw material gas used gives a bad effect on the tantalum oxide film.

On the other hand, the sputtering method allows easy formation of a film of stable quality and, therefore, it is preferable to use the titanium nitride film sputtered. However, the sputtering method has a defect in the property of step coverage. Therefore, it is extremely difficult for the sputtering method to form a titanium nitride film in the cavity 15 under the storage node 13 and the side walls 14. As a result, the tantalum oxide film is partially exposed to thereby be in contact with the tungsten silicide film as the upper electrode and with the interlayer dielectric layer. This results in increase of the leak current and decrease of the cumulative charge capacity. The cavity under the storage node, therefore, must be avoided.

In order to avoid generation of the cavity under the storage node, a method has been proposed wherein silicon nitride is used for the uppermost film of the interlayer dielectric layer while silicon oxide is used for the protective film on the storage node. This method will be described below with reference to FIGS. 2A to 2F.

Figure 2A:
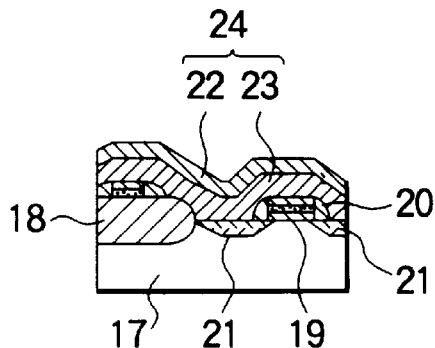
FIGS. 2A to 2F are sectional views illustrating different steps of another known method for production of a semiconductor device having a stack type capacitor therein.

As shown in FIG. 2A, a field insulating film 18 for isolating an element area is at first formed on a silicon substrate 17, and a gate insulating film 19, a gate electrode 20, and an n-type diffusion layer 21 are provided on the element area. Then, an interlayer dielectric layer 24 is formed thereon which is composed of silicon nitride film 22 and silicon oxide film 23.

Figure 2B:
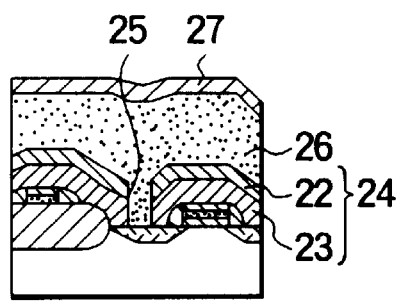

As shown in FIG. 2B, a contact hole 25 is then bored in the interlayer dielectric layer 24. Subsequently, a polycrystalline silicon layer 26 for a storage node is formed and a silicon oxide film 27 is formed on the polycrystalline silicon layer 26 which is for a protective film during a etching step for the formation of polycrystalline silicon side walls.

Figure 2C:
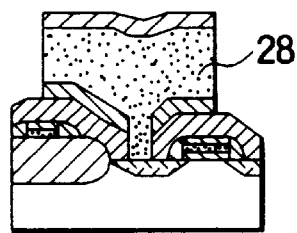

Referring to FIG. 2C, a storage node 28 is then formed by selectively dry etching the polycrystal-line silicon layer 26 and the silicon oxide film 27.

Figure 2D:
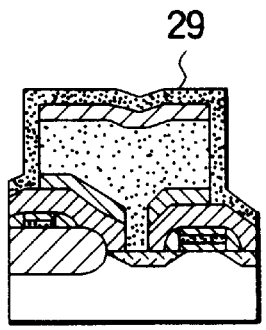

Then, a polycrystalline silicon layer 29 is formed on the silicon oxide layer 27, the side surfaces of the storage node 28 and the interlayer dielectric layer 24, as shown in FIG. 2D.

Figure 2E:
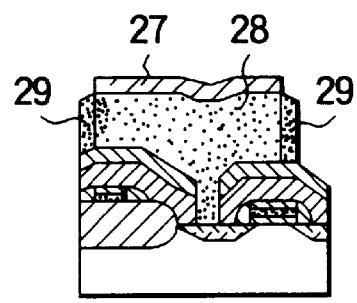

Subsequently, the poly-silicon layer 29 is subjected to the dry anisotropic etching. As a result, the polycrystalline silicon layer 29 partially remains as side walls only on the side surfaces of the storage node 28 as shown in FIG. 2E.

Figure 2F:
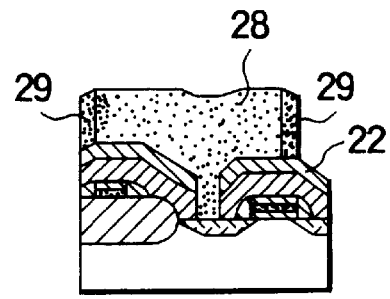

Finally, the silicon oxide film 27, i.e. a protective film, on the storage node 28 is removed as shown in FIG. 2F. Thus, the storage node with the side walls is completed as the lower electrode of the stack type capacitor.

When a hydrofluoric acid-base etching agent is used for removal of the silicon oxide protective film 27, it does not affect the silicon nitride film 22 so that no cavity is formed under the storage node 28.

However, the resultant semiconductor has the silicon nitride therein. This causes such problems as deterioration in the isolation characteristics and an increase of leakage as described in the preamble.

Now, a first embodiment of this invention will be described below with reference to FIGS. 3A–4J.

Figure 3A:
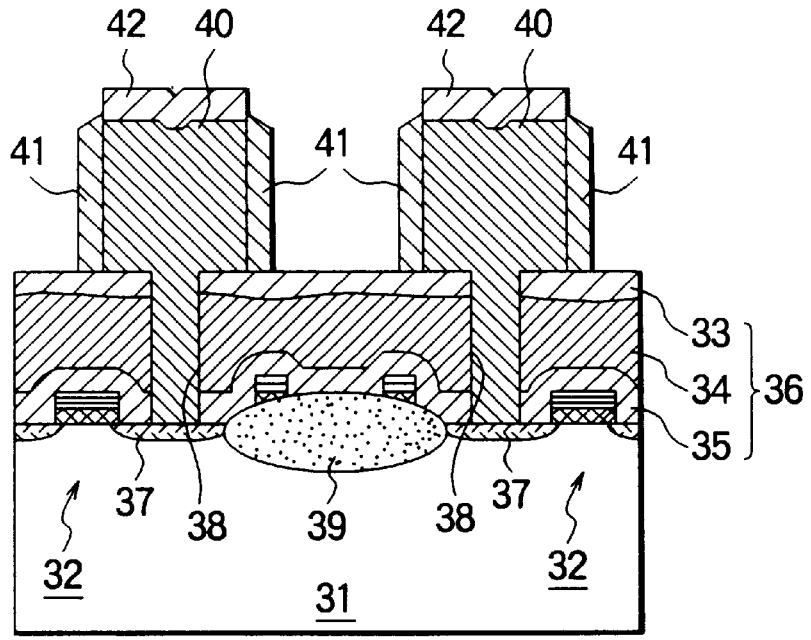
FIGS. 3A and 3B are sectional views illustrating structures of a specific step and a complete step in a production process of a semiconductor device according to a first embodiment of this invention.

Referring to FIG. 3A, MOSFETs 32, 32 are formed on a silicon substrate 31 and are isolated by a field oxide film 39, and are covered with an interlayer dielectric layer 36 which consists of a silicon oxide film 33, a boron phosphosilicate glass (BPSG) film 34, and a silicon oxide film 35. Contact holes 38 are bored in the interlayer film 36 and extend to an impurity-diffused layers 37 of MOSFETs 32. On the interlayer dielectric layer 36, storage nodes 40 of polycrystalline silicon are formed to fill the contact holes 38. Side walls 41 of poly-silicon are formed on the side surfaces of the storage nodes 40. A silicon nitride film 42 is formed on the upper surface of each of the storage nodes 40 and serves as protective films for the storage nodes 40 during the formation of the side walls 41.

Figure 3B:
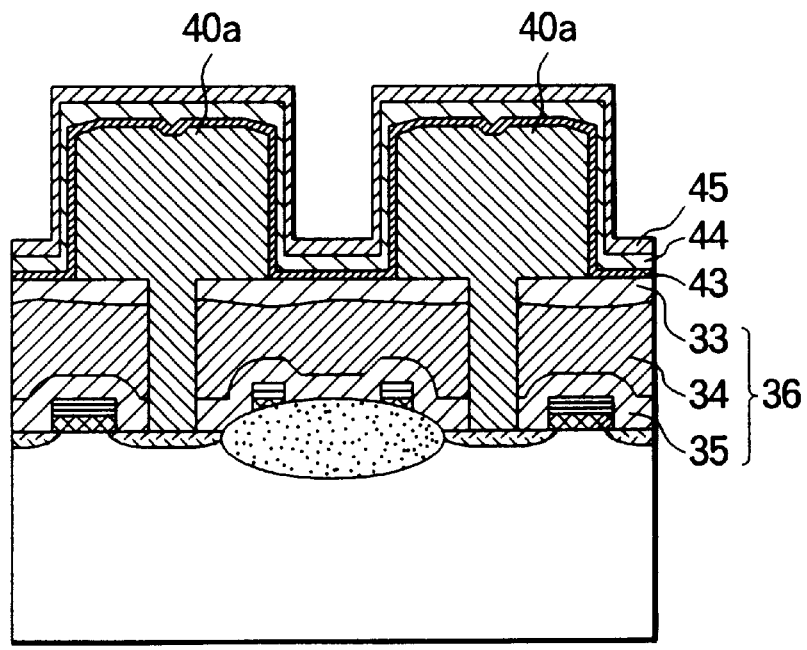

Then, as illustrated in FIG. 3B, the protective film 42 is removed after the formation of the side walls 41 (in the figure, the storage node 40 and their side walls 41 are collectively shown at one body by 40a), and a capacitor dielectric film made of a tantalum oxide film 43 and a plate electrode of a titanium nitride film 44 and a tungsten silicide film 45 are formed.

Next, a detailed description will be made as regards a series of steps for producing the semiconductor device with reference to FIGS. 4A–4J.

Figure 4A:
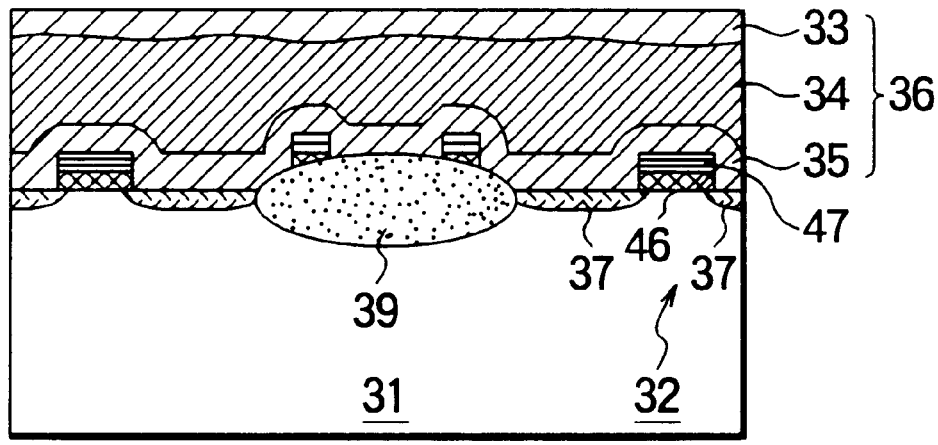
FIGS. 4A to 4J are sectional views illustrating structures of a series of steps in the production process according to the first embodiment of this invention.

Referring to FIG. 4A, the field oxide film 39 is selectively formed on the surface of the silicon substrate 31 to isolate the elements. On each of the element regions isolated, a gate insulating film 46, a gate electrode 47 and the impurity-diffused layers 37 are formed. The latter are used as a source and a drain area of the MOSFET 32. Subsequently, the silicon oxide film 35 of a thickness of 200 nm is deposited by the low-pressure CVD (LPCVD) method and the BPSG film 34 of a thickness of 300 nm is deposited thereon by the normal pressure CVD method.

Further, the silicon oxide film 33 containing no impurity is deposited thereon in a thickness of 200 nm by the LPCVD method and then heat-treated in nitrogen at 850° C. for 10 minutes. The silicon oxide film 35, the BPSG film 34, and the silicon oxide film 33 form together the interlayer film 36.

Figure 4B:
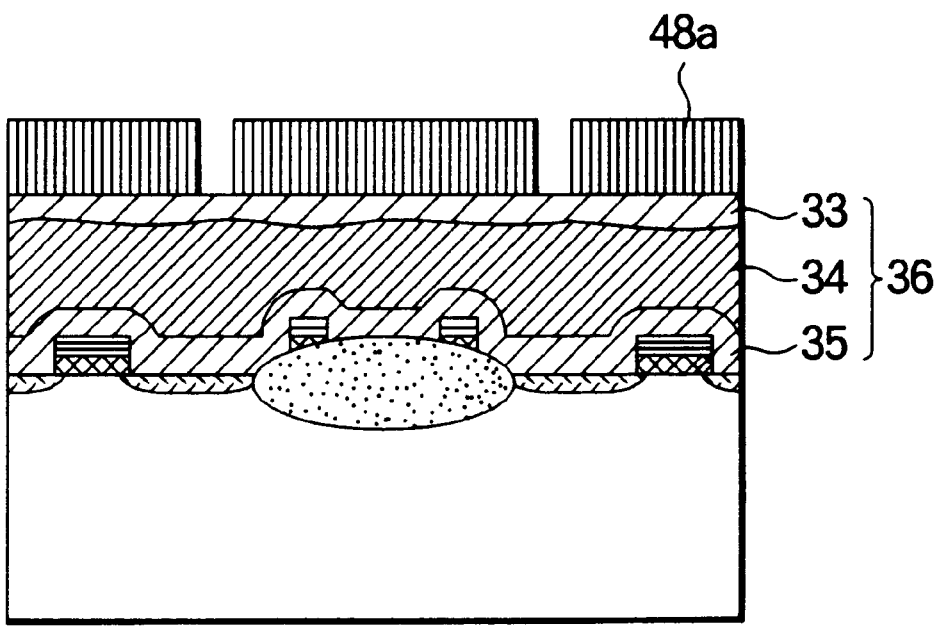
Figure 4C:
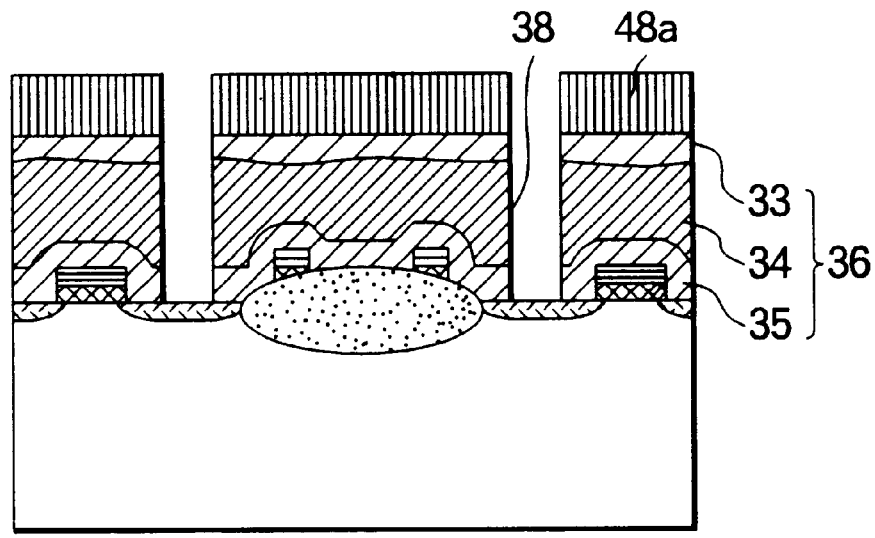

Next, a resist pattern 48a for the contact holes 38 is formed on the silicon oxide film 33 as shown in FIG. 4B and the contact holes 38 are bored in the interlayer dielectric layer 36 by dry etching as shown in FIG. 4C. Thereafter, the resist 48a is removed.

Figure 4D:
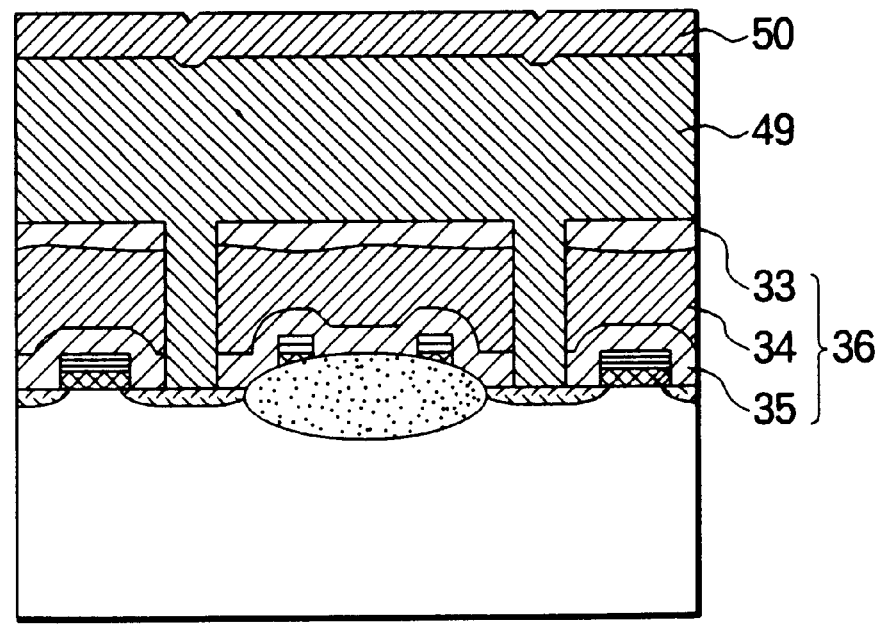
Figure 4E:
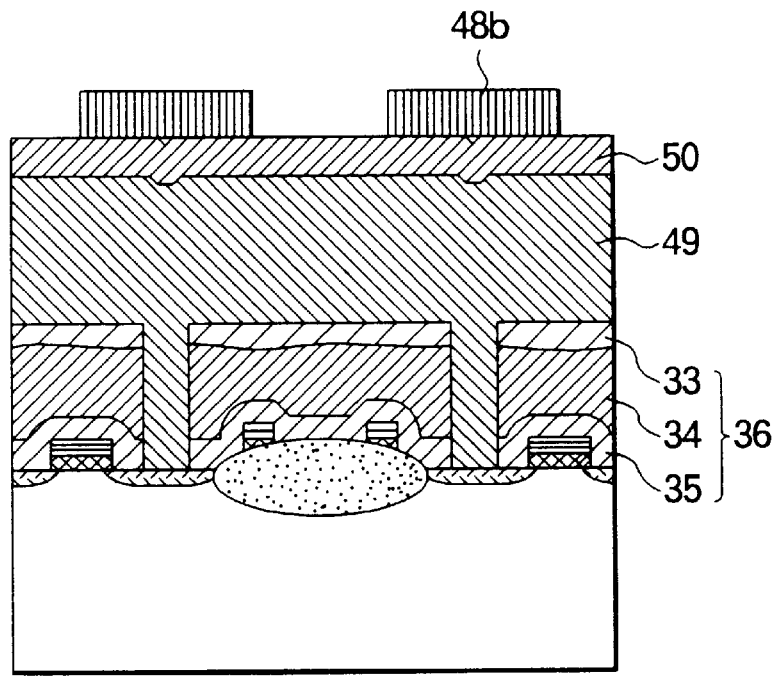
Figure 4F:
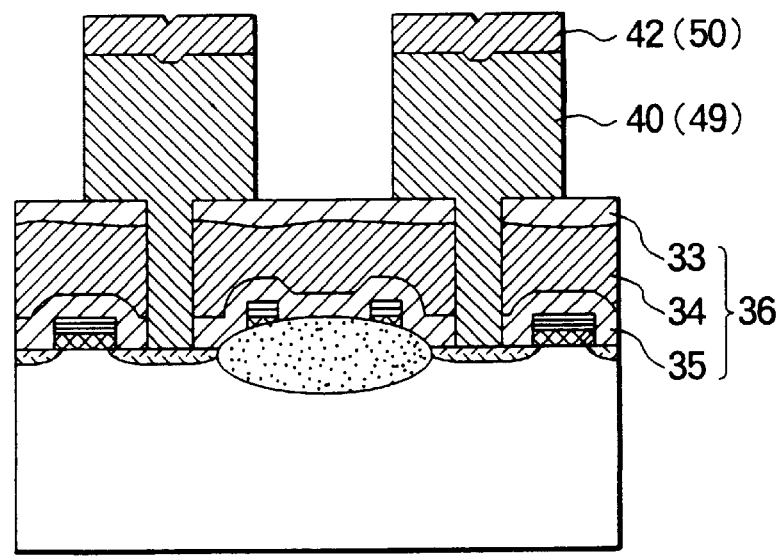

Then, a poly-silicon film 49 of a thickness of 800 nm is deposited on the interlayer dielectric layer 36 as shown in FIG. 4D and is doped with phosphorus, thereafter a silicon nitride film 50 having a thickness of 50 nm being formed. Next, as shown in FIG. 4E, a pattern of resist 48b is formed on the silicon nitride film 50 and subsequently, as shown in FIG. 4F, the silicon nitride film 50 and the poly-silicon film 49 are selectively dry-etched through the mask of the resist 48b to form the storage node 40 and the protective film 42 for protecting the storage node 40 during the subsequent formation of side walls.

Figure 4G:
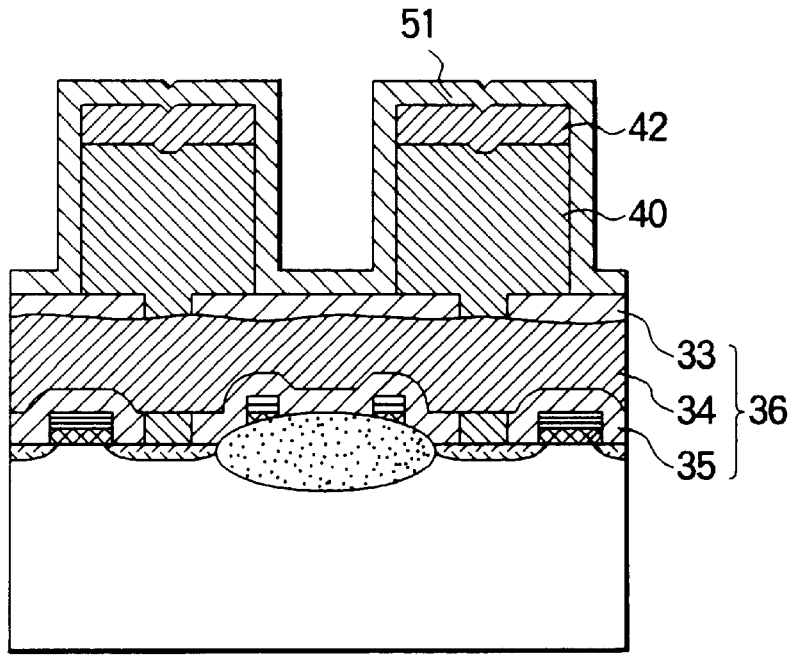
Figure 4H:
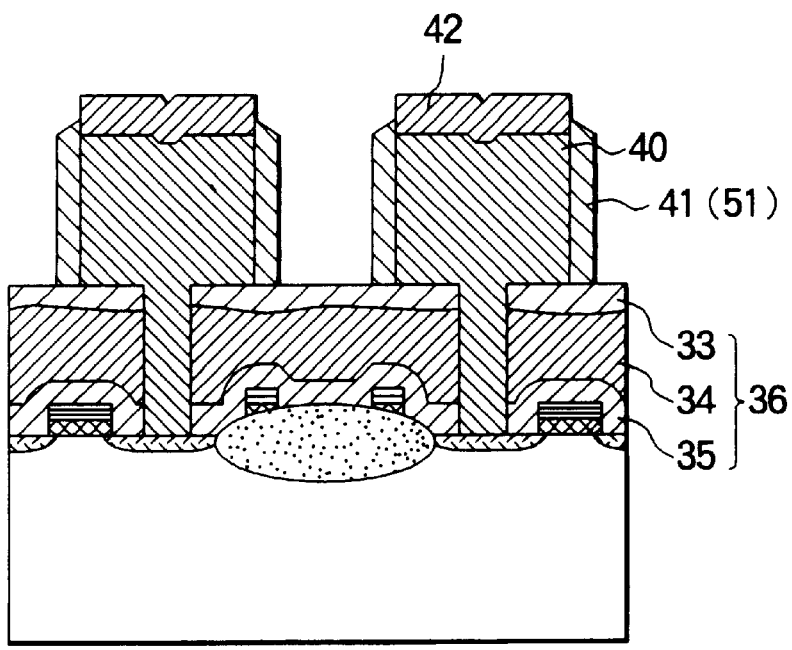

Next, as shown in FIG. 4G, a poly-silicon film 51 for side walls is formed thereon in a thickness of 100 nm and then doped with phosphorus. Thereafter, the poly-silicon film 51 is subjected to the anisotropic dry-etching to remove the portions of the polysilicon film 51 on the interlayer dielectric layer 36 and the protective film 42. During the dry etching, the protective film 42 protects the storage node 40 against the action of etching. As a result, the poly-silicon film 51 partially remains only on the side surfaces of the storage node 40 to form the side walls 41 as shown in FIG. 4H.

Figure 4I:
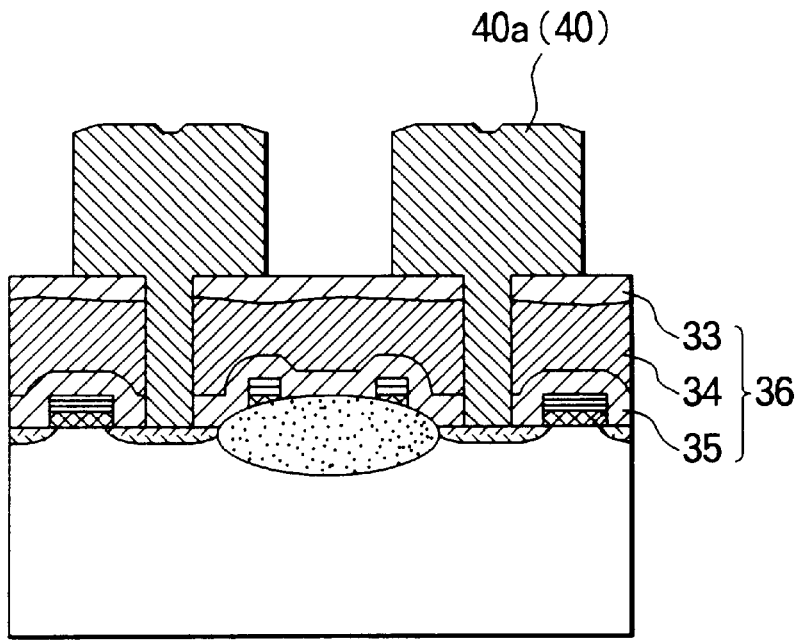

Subsequently, the protective film 42 which remains on the storage node 40 is removed as shown in FIG. 4I, by the use of phosphoric acid heated to 160° C. The wet etching treatment by the phosphoric acid for 5–10 minutes is required so as to completely remove the silicon nitride film of 50 nm thickness formed as the protective film 42. Since the etching selectivity ratio of silicon nitride film/silicon oxide film in phosphoric acid is in the approximate range of 10–20, the silicon oxide film 33 below the storage node 40 is only etched in a depth of several nanometers during the complete removal of the silicon nitride film as the protective film 42. While the etching has the possibility of producing a very small cavity of several nanometer below the storage node 40, the cavity causes no problem because it is filled up with a capacitor dielectric film formed in the subsequent step.

In the present embodiment, the silicon oxide film 33 used contains no impurity and, therefore, has a low etching rate against the phosphoric acid and secures a high etching selectivity ratio. Further, the heat treatment carried out in nitrogen at 850° C. for 10 minutes after the deposition of the silicon oxide film 33 is intended to densify the silicon oxide film 33 and consequently increase the etching selectivity ratio. As a result, the storage node 40a with the side walls is formed without any cavity as shown in FIG. 4I.

Figure 4J:
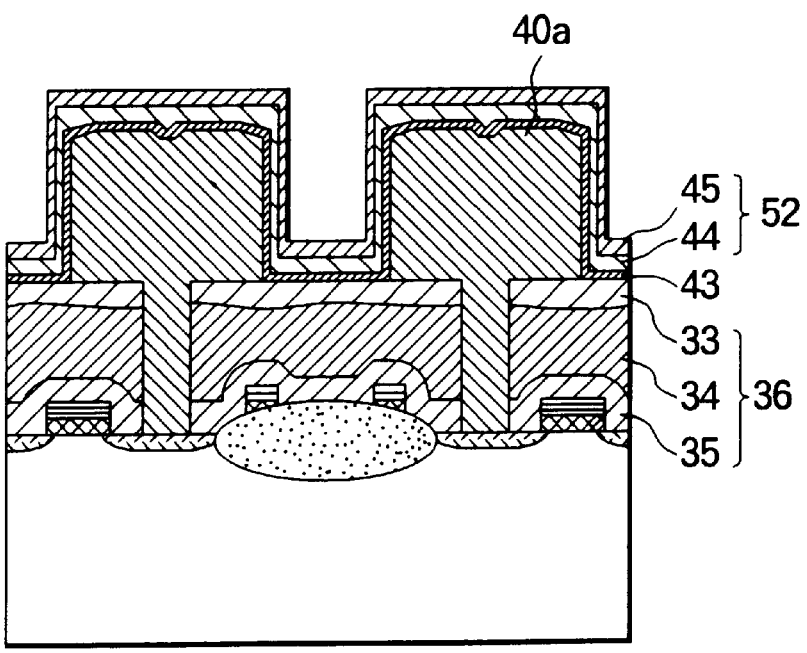

Thereafter, the surface of the storage node 40a with the side walls is subjected to a rapid thermal nitridation treatment in ammonia gas at 900° C. for one minute and then, as shown in FIG. 4J, the tantalum oxide film 43 of a thickness of 11 nm is deposited by the CVD method using a raw material gas resulting from evaporation of an organic tantalum (such as, for example, $Ta(OCH_5)_5$) and oxygen gas. Further, the titanium nitride film 44 of a thickness of 100 nm is formed by the sputtering method or the reactive sputtering method and the tungsten silicide film 45 of a thickness of 110 nm is formed by the sputtering method. These films are formed into a plate electrode 52. Thus, the stack type capacitor is completed.

In the present embodiment, a silicon nitride film is used as the protective film 42 of the upper surface of the storage node 40 and a silicon oxide film is used for the uppermost film of the interlayer dielectric layer 36. Further, the protective film 42 is removed by the wet etching using hot phosphoric acid which has a large etching selectivity ratio of silicon nitride film/silicon oxide film. Accordingly, the silicon oxide film 33 as the uppermost film of the interlayer dielectric layer 36 is not almost corroded by the wet etching of the silicon nitride protective film 42. Therefore, the storage node 40a with the side walls can be formed without any cavity under the storage node. Further, the silicon nitride film is removed and the silicon oxide alone is remains as the uppermost film of the interlayer dielectric layer. Therefore, the semiconductor device produced according to the present embodiment is free from such problems as isolation deterioration and increase of leakage which are unavoidable in a known production technique using a silicon nitride film. Thus, the present embodiment can provide a semiconductor device having excellent electrical properties.

Figure 5:
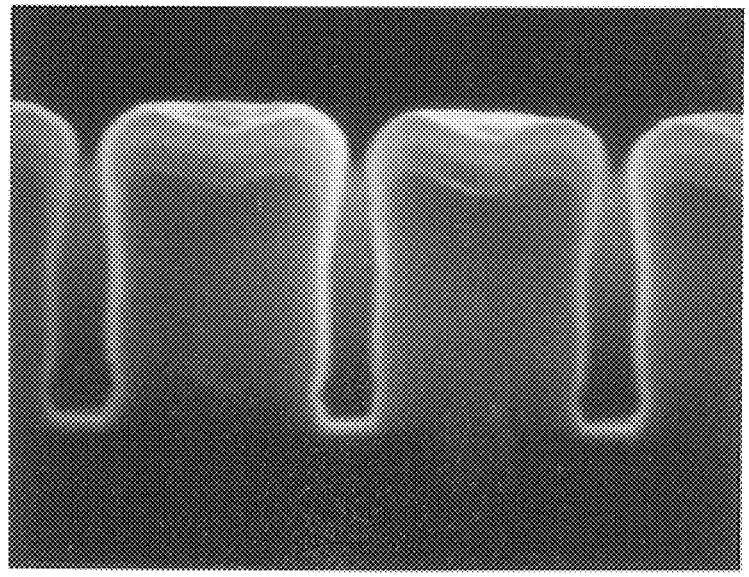
FIG. 5 is a microphotograph of a sectional view of a tantalum oxide film capacitor formed according to the method described above.
Figure 6:
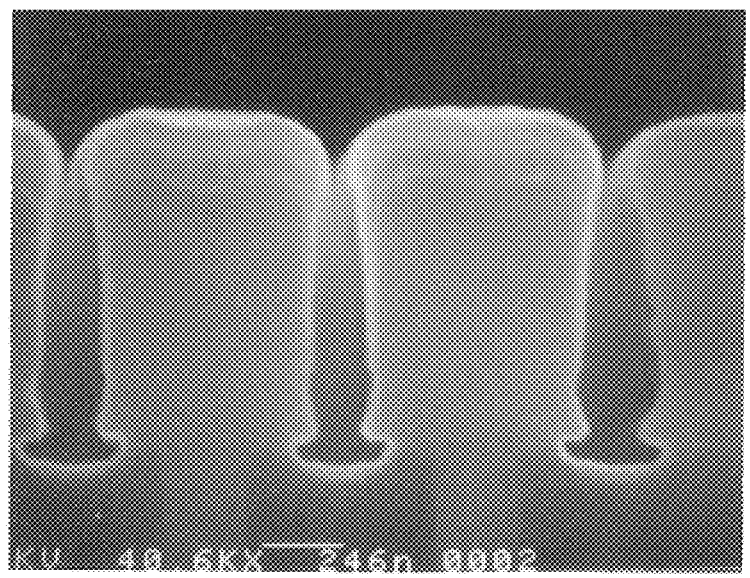
FIG. 6 is a microphotograph of a sectional view of a tantalum oxide film capacitor formed in accordance with the conventional method.

FIG. 5 is a microphotograph showing a sectional view of the tantalum oxide film capacitor which was actually produced by the method of the present embodiment. In comparison, FIG. 6 is also a similar microphotograph of the tantalum oxide film capacitor which was produced by the known method described in connection with FIGS. 1A–1F. It is clearly noted from both of the photographs that the interlayer dielectric layer under the storage node formed by the method of the present embodiment does not have any cavity at all. This is because it is not corroded during the etching treatment for the removal of the protective film. On the contrary, there is observed a cavity formed in the interlayer dielectric layer under the side walls of the storage node formed by the known production technique.

Figure 7:
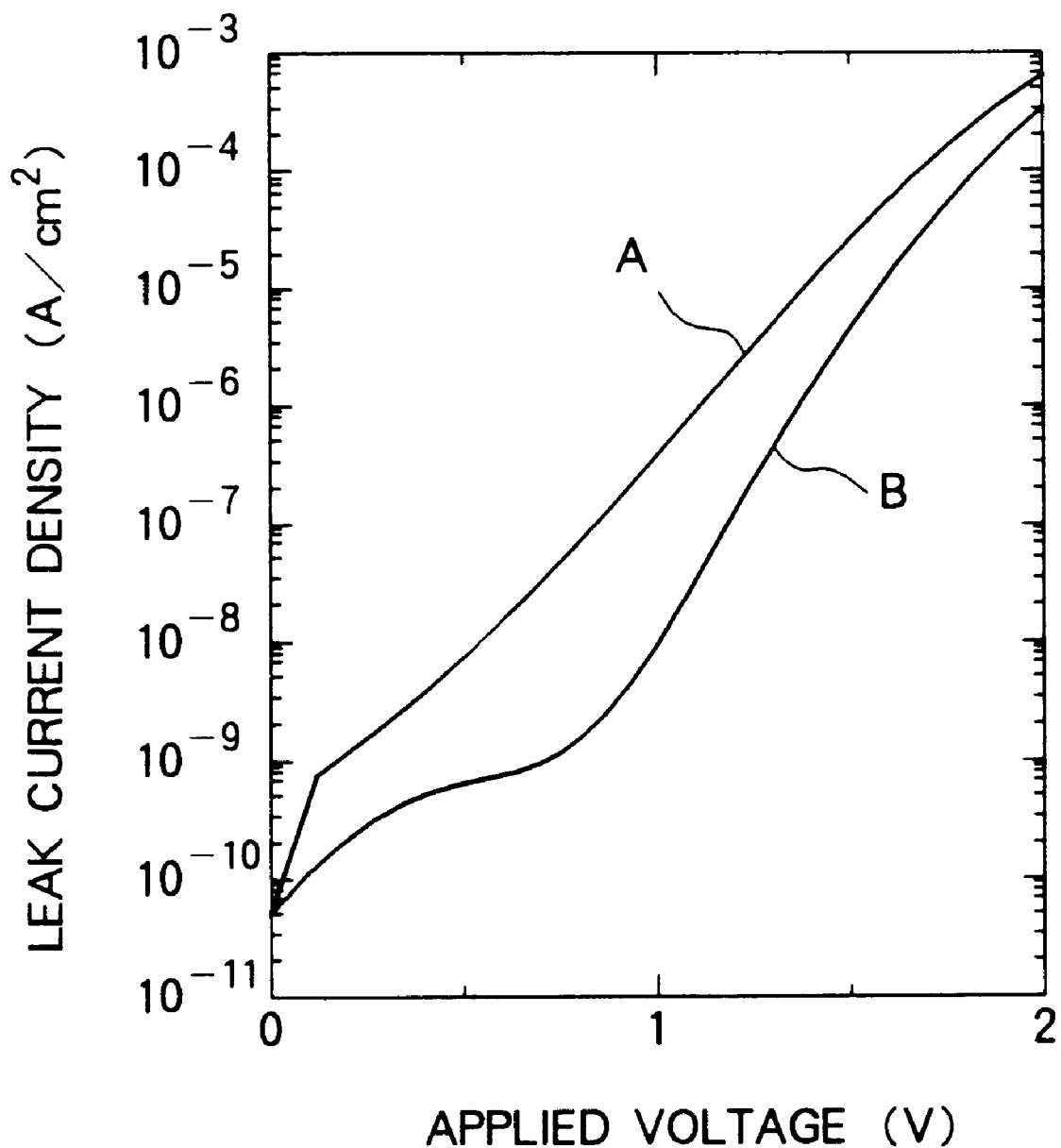
FIG. 7 is a graph showing the leak current property of the tantalum oxide film capacitor for the purpose of demonstrating the effect of the embodiment mentioned above.

FIG. 7 shows the leak current properties of the tantalum oxide film capacitors formed by the known method (A) and the present embodiment (B). It is clearly noted from the figure that the leak current property of the capacitor according to the present embodiment is superior to that of the capacitor with cavity using the known technique.

Now, the second embodiment of this invention will be described below with reference to FIGS. 8A–8J.

Figure 8A:
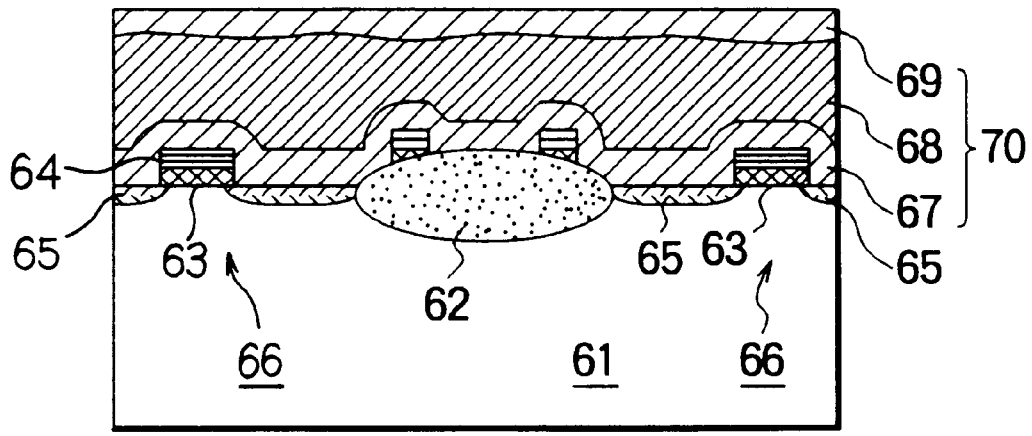
FIGS. 8A to 8J are sectional views illustrating structures of a series of steps in a production process of a semiconductor device according to a second embodiment of this invention.

At first, referring to FIG. 8A, a field oxide film 62 is formed on the surface of a silicon substrate 61 to isolate element regions to each other, in the similar manner to the first embodiment, and MOSFETs 66 are then formed on the isolated element regions, each comprising a gate insulating film 63, a gate electrode 64, and an impurity diffused layer 65. Thereafter, a silicon oxide film 67 having a thickness of 200 nm, a BPSG film 68 having a thickness of 300 nm, and a silicon oxide film 69 having a thickness of 200 nm are sequentially deposited one after another. An interlayer dielectric layer 70 comprises the silicon oxide film 67, the BPSG film 68, and the silicon oxide film 69.

Figure 8B:
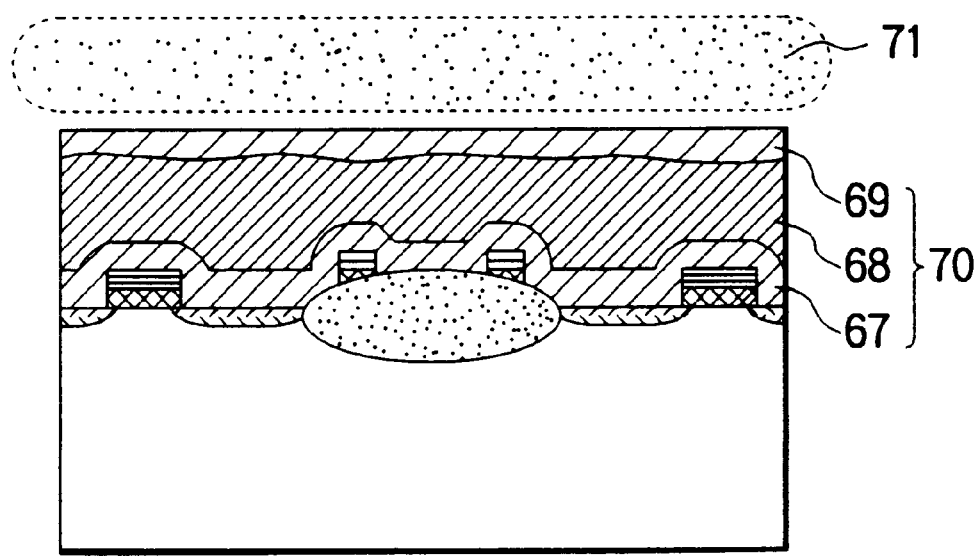

Next, the surface of the silicon oxide film 69 is subjected to a nitrogen plasma treatment as shown in FIG. 8B. The nitrogen plasma treatment is carried out for one minute by the use of a high frequency electric power of 200 watts (W) and 13.58 MHz under a pressure of 1.0 Torr. In the treatment, a nitrogen-containing plasma 71 is formed by using a gas containing nitrogen ($N_2$), nitrogen suboxide ($N_2O$), and ammonia ($NH_3$). In consequence of this nitrogen plasma treatment, the surface of the silicon oxide film 69 graded up in the corrosion resistance against the hydrofluoric acid-base etching agent.

Figure 8C:
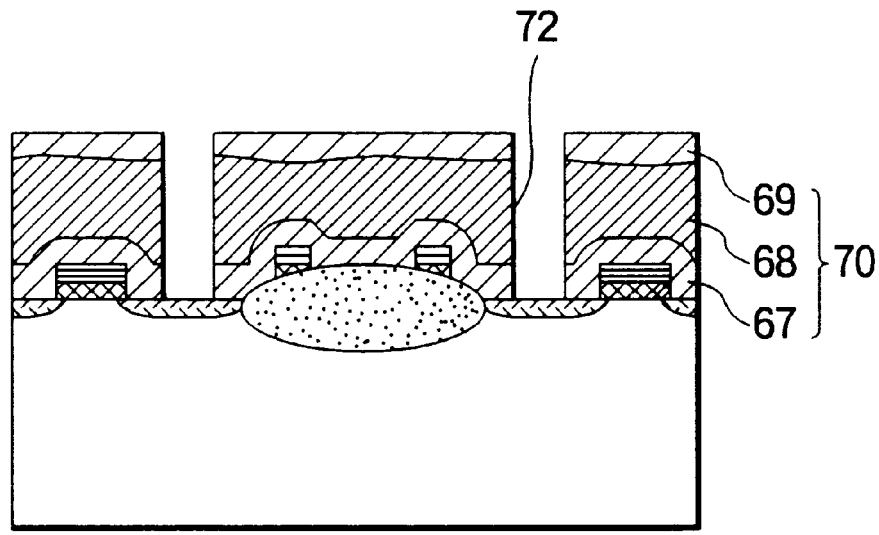
Figure 8D:
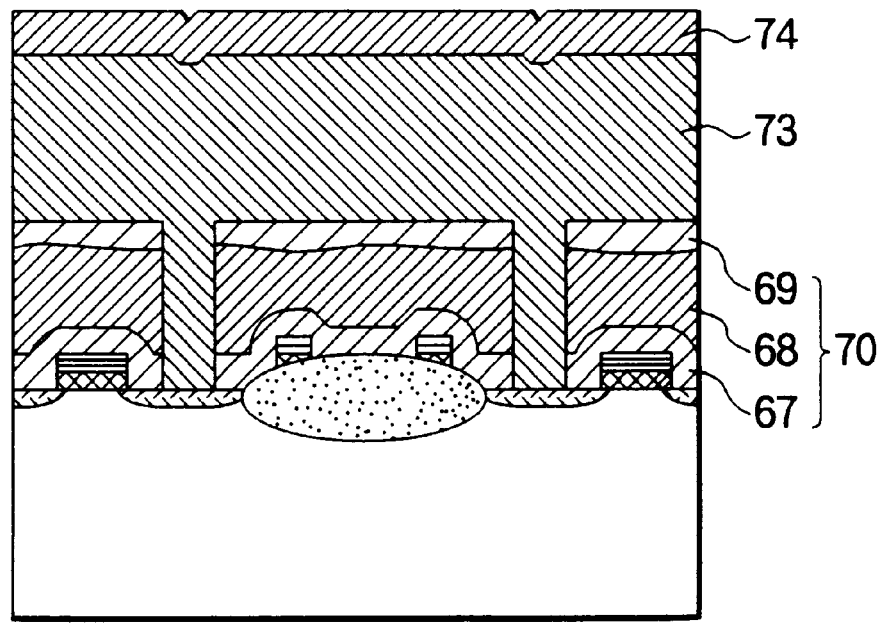

Next, a contact hole 72 is bored in the interlayer dielectric layer 70 as shown in FIG. 8C and then a polycrystalline silicon film 73 is deposited in a thickness of 800 nm by the CVD method as shown in FIG. 8D. Then, the polycrystalline silicon film 73 is doped with phosphorus and a silicon oxide film 74 is formed in a thickness of 50 nm.

Figure 8E:
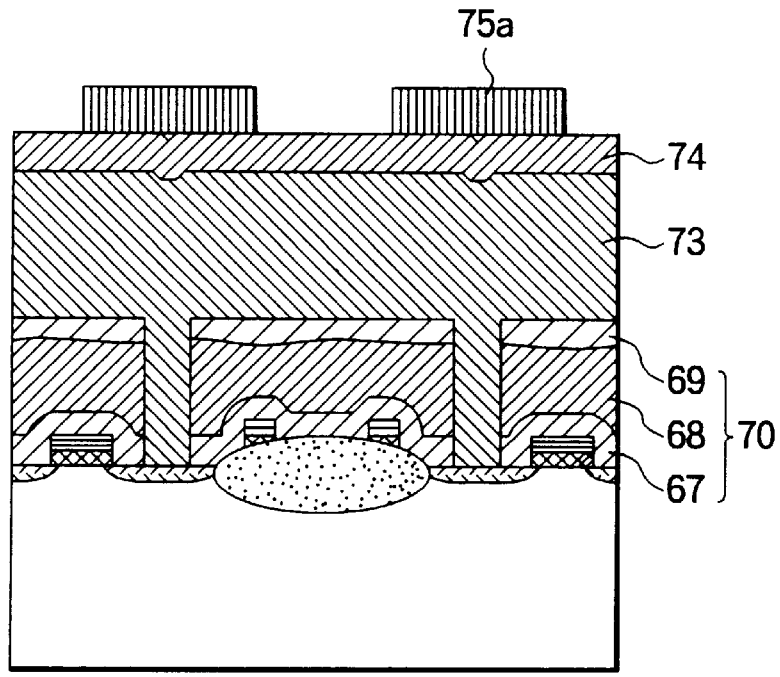
Figure 8F:
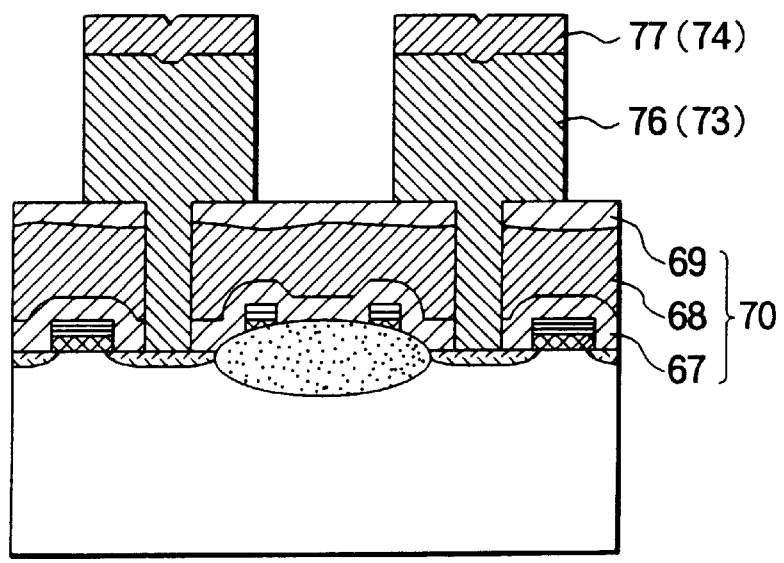

Then, a resist 75a is formed in a prescribed pattern on the silicon oxide film 74 as shown in FIG. 8E and the selective etching is carried out for the poly-silicon film 73 and silicon oxide film 74 to form a storage node 76 and a protective film 77, respectively, as shown in FIG. 8F. The protective film 77 is for protecting the storage node 76 during the etching for formation of side walls. Then, the resist 75a is removed.

Figure 8G:
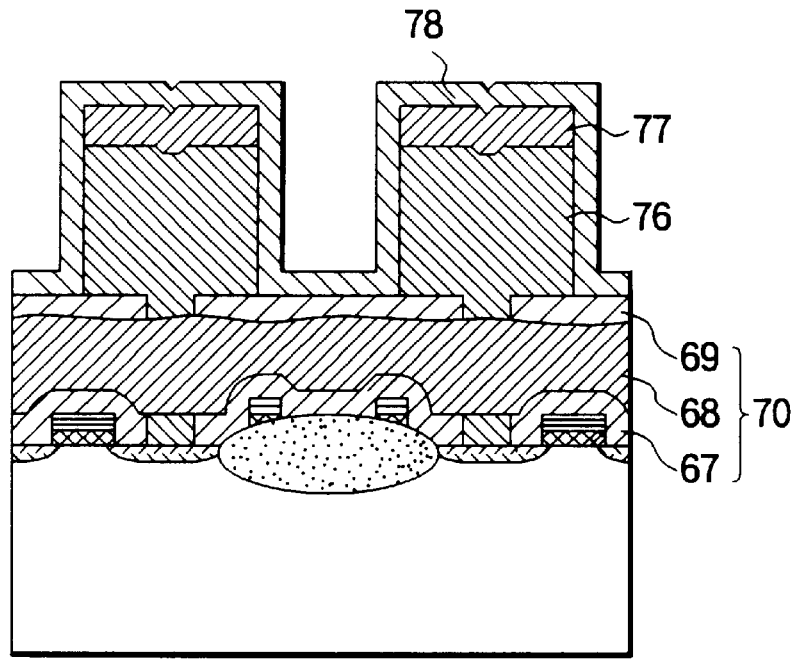
Figure 8H:
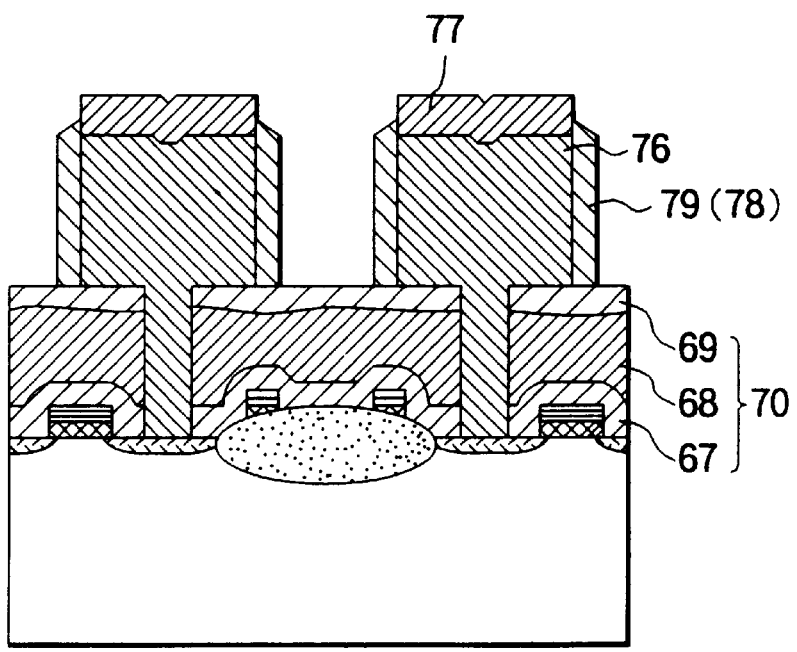

Thereafter, a poly-silicon film 78 is formed for the side walls in a thickness of 100 nm and is doped with phosphorus, as shown in FIG. 8G. Then, the entire surface of the poly-silicon film 78 is subjected to anisotropic dry-etching, the portions of the poly-silicon film 78 on the protective film 77 and interlayer dielectric layer 70 are selectively removed. During the dry etching, the protective film 77 protects the storage node 76 against the action of etching. As a result, the poly-silicon film 78 remains only on the side surfaces of the storage node 76 and makes side walls 79 as shown in FIG. 8H.

Figure 8I:
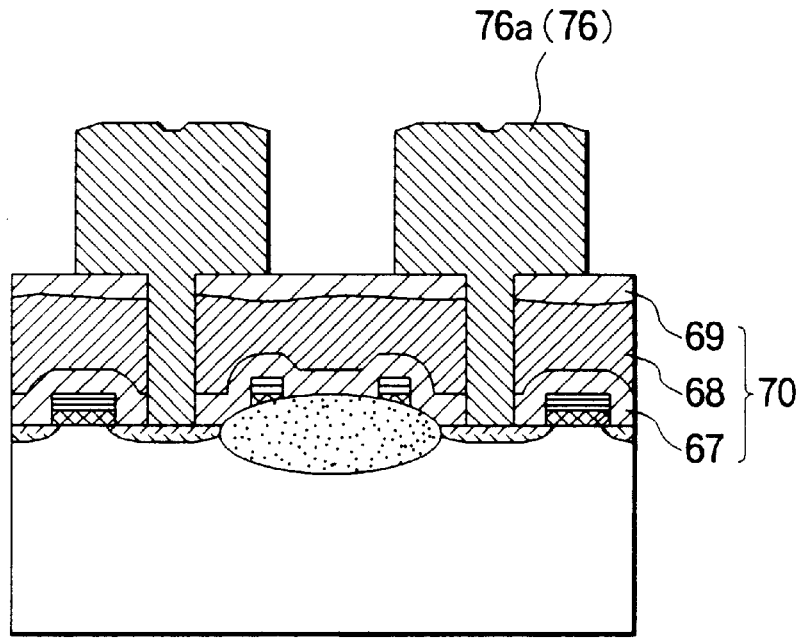

Then, the protective film 77 remaining on the storage node 76 is removed by the use of a 130 buffered hydrofluoric acid. The complete removal of the silicon oxide protection film 77 of a thickness of 50 nm is achieved by the wet etching for 3 minutes. Since the silicon oxide film 69 of the uppermost film of the interlayer dielectric layer 70 gains the corrosion resistance against the 130 buffered hydrofluoric acid as a result of the nitrogen plasma treatment as described above, the storage node 76a with the side walls is formed without any cavity formed in the uppermost silicon oxide film 69, as shown in FIG. 8I.

Figure 8J:
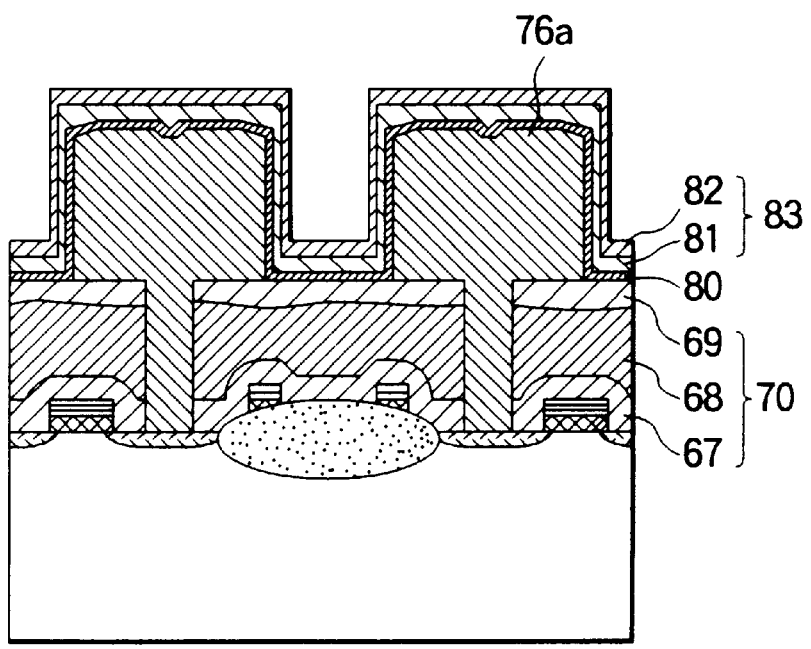

Thereafter, the surface of the storage node 76a with the side walls is subjected to a rapid thermal nitridation treatment in ammonia gas at 900° C. for one minute. Then, a tantalum oxide film 80 of a thickness of 11 nm is formed by the CVD method using a raw material gas resulting from vaporization of an organic tantalum (such as, for example, Ta(OCH$_5$)$_5$) and oxygen gas, as shown in FIG. 8J. Further, a titanium nitride film 81 of a thickness of 100 nm is formed by the sputtering method or the reactive sputtering method and a tungsten silicide film 82 of a thickness of 110 nm is formed by the sputtering method. Thus, an upper plate electrode comprises these films, and the stack type capacitor is completed.

The present embodiment is different from the first embodiment in that silicon oxide films are used for both of the protective film 77 and the uppermost layer 69 of the interlayer dielectric layer 70. However, the silicon oxide film 69 of the interlayer dielectric film is subjected to the nitrogen plasma treatment and is therefore graded up in the corrosion resistance against the wet etching liquid. Accordingly, the silicon oxide film 69 is not corroded by the wet etching liquid and the storage node 76a with the side walls can therefore be produced without any cavity made.

Figure 9:
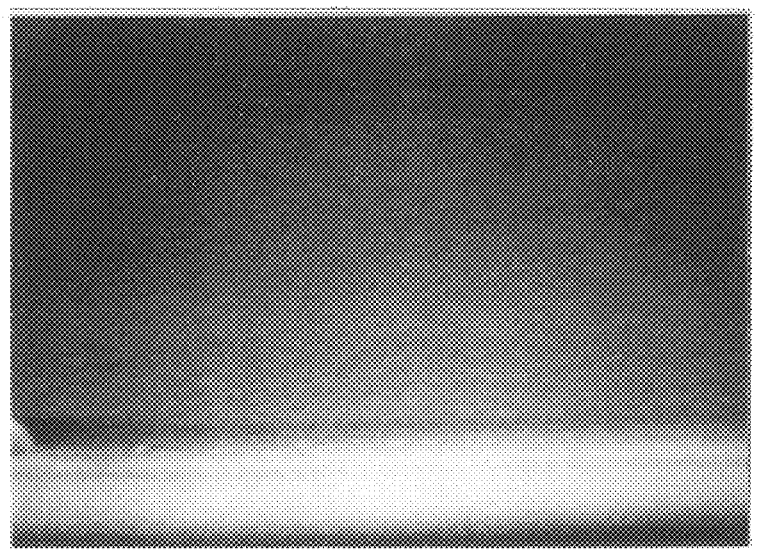
FIG. 9 is a microphotograph illustrating a sectional view of a silicon oxide film subjected to a nitrogen plasma treatment.
Figure 10:
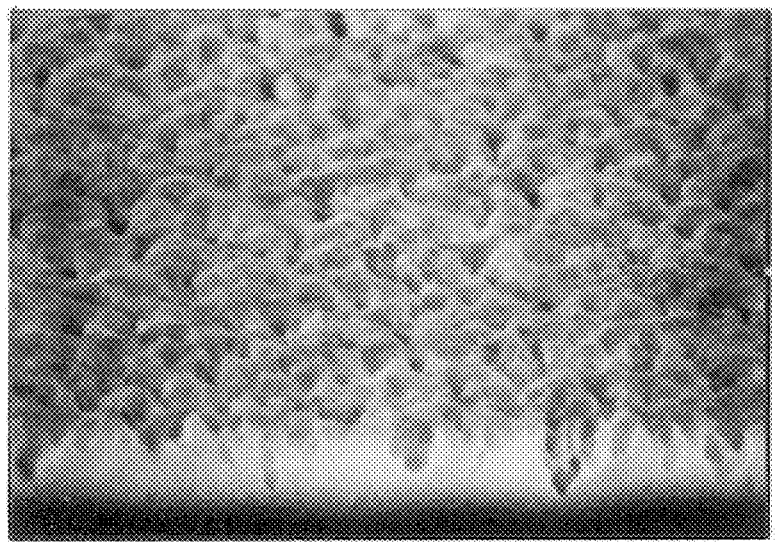
FIG. 10 is a microphotograph illustrating a sectional view of a silicon oxide film not subjected to a nitrogen plasma treatment.

The effect of the nitrogen plasma treatment is shown in FIGS. 9 and 10.

FIG. 9 and FIG. 10 are microphotographs of the cross sections resulting from etching with a 130 buffered hydrofluoric acid the silicon oxide films respectively produced by performing the nitrogen plasma treatment under the conditions shown above and produced not by performing the nitrogen plasma treatment. It is clearly noted from these photographs that the surface of the silicon oxide film which had undergone the nitrogen plasma treatment was corroded only sparingly by the 130 buffered hydrofluoric acid and the surface of the silicon oxide film which had not undergone the nitrogen plasma treatment was notably corroded.

Further, since the uppermost layer of the interlayer dielectric layer 70 is of a silicon oxide film, the problems such as isolation deterioration and increase of the leakage cannot be caused. The present embodiment, similarly to the first embodiment, can provide a semiconductor device which is excellent in electrical properties.

It should be understood that this invention is not limited to the particular embodiments shown and described herein, but that various changes and modifications may be made without departing from the spirit and scope of this novel concept of this invention. As concerns the specific numerical values indicating the thicknesses of various films and the treating conditions of various steps of process, for example, they do not need to be limited to those mentioned in the preceding embodiments but may be suitably altered.

Within the scope of the invention claimed in the claims appended hereto, this invention further allows the following variations:

(1) The nitrogen-containing plasma can be generated by using a gas comprising nitrogen (N$_2$), nitrogen suboxide (N$_2$O), and ammonia (NH$_3$).

(2) The metal oxide film as the capacitor dielectric film for the stack type capacitor is at least one member selected from the group consisting of tantalum oxide film (Ta$_2$O$_5$), hafnium oxide film (HfO$_2$), zirconium oxide film (ZrO$_2$), niobium oxide film (Nb$_2$O$_5$), yttrium oxide film (YO$_3$), aluminum oxide film (Al$_2$O$_3$), and titanium oxide film (TiO$_2$).

(3) The upper electrode of the stack type capacitor is either a single layer film formed of one member selected from among titanium (Ti), tungsten (W), molybdenum (Mo), tantalum (Ta), and nitrogen compounds thereof by the sputtering method or the chemical vapor phase growth method or a laminate having superposed on the single layer film mentioned above at least one film formed of a member selected from among silicide compounds of such metals as mentioned above and polycrystalline silicon.

What is claimed is:

1. A method for producing a semiconductor device including a storage node, having side walls, formed on an interlayer dielectric layer which is formed on a semiconductor substrate, said method comprising:

preparing said semiconductor substrate having said interlayer dielectric layer formed thereon, said interlayer dielectric layer having an uppermost film of silicon oxide;

nitrogen plasma treating said uppermost film of silicon oxide; and forming said storage node with said walls on said interlayer dielectric layer.

2. The method as claimed in claim 1, wherein said step of forming said storage node with said side walls comprises:

forming a first poly-silicon layer overlying said interlayer dielectric layer;

forming a silicon oxide layer overlying said first poly-silicon layer;

selectively removing said first poly-silicon layer and said silicon oxide layer to form said storage node of said first poly-silicon at a predetermined region on said interlayer dielectric layer and forming a protective layer of said silicon oxide on said storage node, said storage node having side surfaces;

forming a second poly-silicon layer overlying said interlayer dielectric layer, said protective layer and said side surfaces of said storage node; and partially removing said second poly-silicon layer wherein portions of said second poly-silicon layer remain on said side surfaces of said storage node as said side walls.

3. The method as claimed in claim 2, said semiconductor device having a stack capacitor using said storage node with said side walls as a lower electrode, said method further comprising:

removing said protective layer after partially removing said second poly-silicon layer forming a metal oxide as a capacitor dielectric layer over said storage node, said side walls, and said interlayer dielectric layer; and forming an upper electrode over said metal oxide to complete said stack capacitor.

\* \* \* \* \*

UNITED STATES PATENT AND TRADEMARK OFFICE
CERTIFICATE OF CORRECTION

PATENT NO.: 6,048,764
DATED: April 11, 2000
INVENTOR(S): Hiroshi SUZUKI, Akira KUBO It is certified that error(s) appears in the above-identified patent and that said Letters Patent is hereby corrected as shown below:

Column 1, line 20, delete "16552" insert --165552--.

Signed and Sealed this

Twenty-fourth Day of April, 2001

Attest:

NICHOLAS P. GODICI

Attesting Officer

Acting Director of the United States Patent and Trademark Office